United States Patent
Lupino et al.

(10) Patent No.: US 8,952,470 B2
(45) Date of Patent: Feb. 10, 2015

(54) LOW COST HIGH DENSITY NONVOLATILE MEMORY ARRAY DEVICE EMPLOYING THIN FILM TRANSISTORS AND BACK TO BACK SCHOTTKY DIODES

(71) Applicants: James John Lupino, Minneapolis, MN (US); Tommy Allen Agan, Maple Grove, MN (US)

(72) Inventors: James John Lupino, Minneapolis, MN (US); Tommy Allen Agan, Maple Grove, MN (US)

(*) Notice: Subject to any disclaimer, the term of this patent is extended or adjusted under 35 U.S.C. 154(b) by 0 days.

(21) Appl. No.: 14/021,216

(22) Filed: Sep. 9, 2013

(65) Prior Publication Data

US 2014/0103471 A1    Apr. 17, 2014

Related U.S. Application Data

(60) Provisional application No. 61/699,211, filed on Sep. 10, 2012, provisional application No. 61/702,485, filed on Sep. 18, 2012.

(51) Int. Cl.
H01L 27/22    (2006.01)

(52) U.S. Cl.
CPC ................. *H01L 27/224* (2013.01)
USPC ........................................ 257/421

(58) Field of Classification Search
CPC .................................... H01L 27/222
USPC ...................................... 257/421
See application file for complete search history.

(56) References Cited

U.S. PATENT DOCUMENTS

| | | | |
|---|---|---|---|
| 5,640,343 A * | 6/1997 | Gallagher et al. | 365/171 |
| 6,341,084 B2 * | 1/2002 | Numata et al. | 365/158 |
| 6,750,540 B2 | 6/2004 | Kim | |
| 6,838,721 B2 | 1/2005 | Garni et al. | |
| 7,224,601 B2 | 5/2007 | Panchula | |
| 7,608,514 B2 | 10/2009 | Hsu et al. | |
| 7,668,005 B2 | 2/2010 | Ueda | |
| 7,968,419 B2 | 6/2011 | Li et al. | |
| 8,227,788 B2 | 7/2012 | Mikawa et al. | |
| 8,289,746 B2 | 10/2012 | Chen et al. | |
| 8,411,494 B2 | 4/2013 | Shukh | |
| 2005/0145909 A1 * | 7/2005 | Giebeler et al. | 257/295 |
| 2007/0063237 A1 * | 3/2007 | Huai et al. | 257/295 |
| 2010/0295012 A1 * | 11/2010 | Mikawa et al. | 257/4 |
| 2012/0224417 A1 | 9/2012 | Wang et al. | |
| 2012/0257449 A1 | 10/2012 | Agan et al. | |
| 2012/0281465 A1 | 11/2012 | Agan et al. | |
| 2013/0044532 A1 | 2/2013 | Bethune et al. | |
| 2013/0223125 A1 | 8/2013 | DeBrosse et. al. | |

OTHER PUBLICATIONS

US 7,529,121, May 2009, Kitagawa et al. (withdrawn).
Myoung-Jae Lee, et. al., Low-Temperature-Grown Transition Metal Oxide Based Storage Materials and Oxide Transistors for High-Density Non-volatile Memory, Advanced Functional Materials, vol. 19, Issue 10, pp. 1587-1593, May 22, 2009.

* cited by examiner

*Primary Examiner* — Marc Armand

(57) ABSTRACT

An improved crosspoint memory array device comprising a plurality of memory cells, each memory cell being disposed at an intersection region of bit and word conductive lines, electrically coupled to one of the first conductive lines at a first terminal and to one of the second conductive lines at a second terminal, and comprising a controllable electrical resistance, wherein a back to back Schottky diode is located between each memory cell and one of the said conductive lines, and wherein each conductive line is electrically coupled to at least two thin film transistors (TFTs). The device is substantially produced in BEOL facilities without need of front end semiconductor production facilities, yet can be made with ultra high density and low cost.

22 Claims, 12 Drawing Sheets

Maximum Ft as a function of M and Fm, assuming TFT size is $12Ft^2$

For a single layer TFT array of sufficient number for addressing bit lines in an area not larger than the related memory array.

Maximum Ft size for transistors for a given matrix of M x N memory cells in a crosspoint memory array, assuming one layer of TFTs occupying same area as memory layer, has sufficient number of TFTs to address the Bit lines (2xN TFTs needed)

Fm = technology node of memory cell (MTJ, BBSD, and conductive line)
Area of memory cell (C) = $4 Fm^2$
Ft = technology node of TFT transistor
Area of transistor (T) = $12 Ft^2$ for example (may range from 6 to 30 $Ft^2$)

Area of matrix = M x N x C (memory cells)
Area of matrix = 2 x N x T (bit driver TFTs)
M x N x C = 2 x N x T
(M x C) / 2 = T
(M x $4Fm^2$) / 2 = $12 Ft^2$
M x $Fm^2$ / 6 = $Ft^2$
Ft = Square Root of (M x $Fm^2$ / 6)

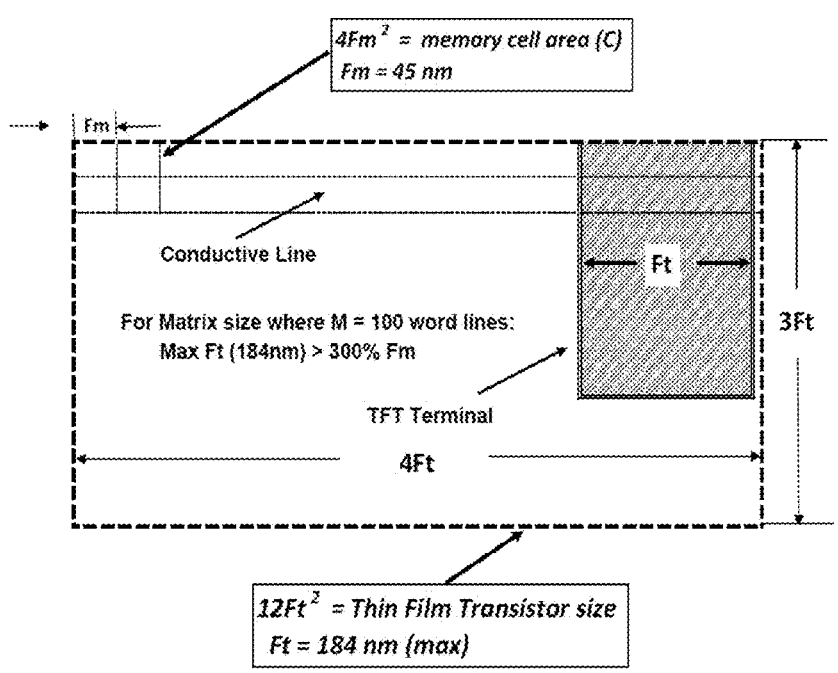

Fig. 11A

Maximum Ft as a function of M and Fm, assuming TFT size (T) is 12Ft²

For a single layer TFT array of sufficient number for addressing bit lines in an area not larger than the related memory array.

Illustrates Decoupling of Technology Node requirement for Fabrication of Cross Point Memory Cell and TFT select transistors ( Assume M = N )

| | Intro Year (Fm) : 2020 | | Matrix side (L) | | Max |
|---|---|---|---|---|---|
| | M | Fm (nm) | L (µm) | L (cm) | Ft (nm) |
| | 1 | 7 | 0.014 | 0.0000014 | 2.9 |
| | 10 | 7 | 0.14 | 0.000014 | 9.0 |
| 10 Kbit > | 100 | 7 | 1.4 | 0.00014 | 29 |
| 1 Mbit > | 1,000 | 7 | 14 | 0.0014 | 90 |
| 100 Mbit > | 10,000 | 7 | 140 | 0.014 | 286 |
| 10 Gbit > | 100,000 | 7 | 1400 | 0.14 | 904 |
| 1 Tbit > | 1,000,000 | 7 | 14000 | 1.4 | 2,858 |

| Intro Year (Fm) : 2010 | | Matrix side (L) | | Max |
|---|---|---|---|---|
| M | Fm (nm) | L (µm) | L (cm) | Ft (nm) |
| 1 | 32 | 0.064 | 6.4E-05 | 13.1 |
| 10 | 32 | 0.64 | 0.000064 | 41.3 |
| 100 | 32 | 6.4 | 0.00064 | 131 |
| 1,000 | 32 | 64 | 0.0064 | 413 |
| 10,000 | 32 | 640 | 0.064 | 1,306 |
| 100,000 | 32 | 6400 | 0.64 | 4,131 |
| 1,000,000 | 32 | 64000 | 6.4 | 13,064 |

| Intro Year (Fm) : 2017 | | Matrix side (L) | | Max |
|---|---|---|---|---|
| M | Fm (nm) | L (µm) | L (cm) | Ft (nm) |
| 1 | 10 | 0.02 | 0.000002 | 4.1 |
| 10 | 10 | 0.2 | 0.00002 | 12.9 |
| 100 | 10 | 2 | 0.0002 | 41 |
| 1,000 | 10 | 20 | 0.002 | 129 |
| 10,000 | 10 | 200 | 0.02 | 408 |
| 100,000 | 10 | 2000 | 0.2 | 1,291 |
| 1,000,000 | 10 | 20000 | 2 | 4,082 |

( Assume M = N )

| | Intro Year (Fm) : 2008 | | Matrix side (L) | | Max |
|---|---|---|---|---|---|
| | M | Fm (nm) | L (µm) | L (cm) | Ft (nm) |
| | 1 | 45 | 0.09 | 0.000009 | 18.4 |
| | 10 | 45 | 0.9 | 0.00009 | 58.1 |
| 10 Kbit > | 100 | 45 | 9 | 0.0009 | 184 |
| 1 Mbit > | 1,000 | 45 | 90 | 0.009 | 581 |
| 100 Mbit > | 10,000 | 45 | 900 | 0.09 | 1,837 |
| 10 Gbit > | 100,000 | 45 | 9000 | 0.9 | 5,809 |
| 1 Tbit > | 1,000,000 | 45 | 90000 | 9 | 18,371 |

| Intro Year (Fm) : 2014 | | Matrix side (L) | | Max |
|---|---|---|---|---|
| M | Fm (nm) | L (µm) | L (cm) | Ft (nm) |
| 1 | 14 | 0.028 | 0.0000028 | 5.7 |
| 10 | 14 | 0.28 | 0.000028 | 18.1 |
| 100 | 14 | 2.8 | 0.00028 | 57 |
| 1,000 | 14 | 28 | 0.0028 | 181 |
| 10,000 | 14 | 280 | 0.028 | 572 |
| 100,000 | 14 | 2800 | 0.28 | 1,807 |
| 1,000,000 | 14 | 28000 | 2.8 | 5,715 |

| Intro Year (Fm) : 2006 | | Matrix side (L) | | Max |
|---|---|---|---|---|
| M | Fm (nm) | L (µm) | L (cm) | Ft (nm) |
| 1 | 65 | 0.13 | 0.000013 | 26.5 |
| 10 | 65 | 1.3 | 0.00013 | 83.9 |
| 100 | 65 | 13 | 0.0013 | 265 |
| 1,000 | 65 | 130 | 0.013 | 839 |
| 10,000 | 65 | 1300 | 0.13 | 2,654 |
| 100,000 | 65 | 13000 | 1.3 | 8,391 |
| 1,000,000 | 65 | 130000 | 13 | 26,536 |

| Intro Year (Fm) : 2012 | | Matrix side (L) | | Max |
|---|---|---|---|---|
| M | Fm (nm) | L (µm) | L (cm) | Ft (nm) |
| 1 | 22 | 0.044 | 0.0000044 | 9.0 |
| 10 | 22 | 0.44 | 0.000044 | 28.4 |
| 100 | 22 | 4.4 | 0.00044 | 90 |
| 1,000 | 22 | 44 | 0.0044 | 284 |
| 10,000 | 22 | 440 | 0.044 | 898 |
| 100,000 | 22 | 4400 | 0.44 | 2,840 |
| 1,000,000 | 22 | 44000 | 4.4 | 8,981 |

| Intro Year (Fm) : 2004 | | Matrix side (L) | | Max |
|---|---|---|---|---|
| M | Fm (nm) | L (µm) | L (cm) | Ft (nm) |
| 1 | 90 | 0.18 | 0.000018 | 36.7 |
| 10 | 90 | 1.8 | 0.00018 | 116.2 |
| 100 | 90 | 18 | 0.0018 | 367 |
| 1,000 | 90 | 180 | 0.018 | 1,162 |
| 10,000 | 90 | 1800 | 0.18 | 3,674 |
| 100,000 | 90 | 18000 | 1.8 | 11,619 |
| 1,000,000 | 90 | 180000 | 18 | 36,742 |

Fig. 11B

LOW COST HIGH DENSITY NONVOLATILE MEMORY ARRAY DEVICE EMPLOYING THIN FILM TRANSISTORS AND BACK TO BACK SCHOTTKY DIODES

CROSS-REFERENCE TO RELATED APPLICATIONS

This application claims priority to Provisional Patent Application No. 61/699,211 having a filing date of Sep. 10, 2012 and to Provisional Patent Application No. 61/702,485 having a subsequent filing date.

FEDERALLY SPONSORED RESEARCH

None.

SEQUENCE LISTING

None.

PRIOR ART REFERENCES

U.S. Patent Application publication 2012/0281465, Nov. 8, 2012—Agan et. al.
U.S. Patent Application publication 2012/0257449, Oct. 11, 2012—Agan et. al.
U.S. Pat. No. 6,750,540, Jun. 15, 2004—Kim
U.S. Pat. No. 5,640,343, Jun. 17, 1997—Gallagher et. al.
U.S. Pat. No. 7,224,601, May 29, 2007—Panchula
U.S. Pat. No. 7,529,121, May 5, 2009—Kitagawa et. al.
U.S. Pat. No. 6,838,721, Jan. 4, 2005—Garni et. al.
U.S. Pat. No. 7,668,005, Feb. 23, 2010—Ueda
U.S. Patent Application publication 2010/0213458, Aug. 26, 2010—Prall
U.S. Pat. No. 8,411,494, Apr. 2, 2013—Shukh
U.S. Pat. No. 8,227,788, Jul. 24, 2012—Mikawa et. al.
U.S. Pat. No. 7,608,514, Oct. 27, 2009—Hsu et. al.
U.S. Pat. No. 7,968,419, Jun. 28, 2011—Li et. al.
U.S. Pat. No. 8,289,746, Oct. 16, 2012—Chen, et. al.
U.S. Patent Application publication 2012/0224417, Sep. 6, 2012—Wang, et. al.
U.S. Patent Application publication 2013/0044532, Feb. 21, 2013—Bethune, et. al.
U.S. Patent Application publication 2013/0223125, Aug. 29, 2013—DeBrosse, et. al.

FIELD OF THE APPLICATION

The present discloser is related to nonvolatile memory arrays and devices; more specifically, to cross-point memory arrays employing back to back schottky diodes at the memory cell and thin-film transistors as a selection element, enabling low cost three-dimensional memory arrays for stand alone memory devices or on-chip embedded memory.

EXPLANATION OF REFERENCE NUMERALS, TEXT AND ABBREVIATIONS 12 pinned (or reference) magnetic layer
14 tunnel barrier layer
16 free (or storage) magnetic layer
18 amorphous semiconductor layer
22 array of memory cells
24 bit line driver
26 word line driver
28 source line driver
30 magnetic random access memory (MRAM) array
60 silicon substrate
61 CMOS circuitry layer
62 interconnect layer
63 MTJ layer including, MTJ elements, back to back Schottky diodes and conductive lines
64 thin film transistor (TFT) layer
65 interconnects
66 word conductive lines—common to two MTJ layers
70 glass substrate
80 conductive line, representing either a bit or word line
81 area available for thin film transistor
82 interconnect between conductive line and thin film transistor
BBSD—back to back Schottky diode
BL, BL1, BL2, BL3 . . . BLN bit line
C, C11-C33 . . . CNM memory cell
Fm minimum feature size of technology node for MTJ layer (including MTJ, conductive lines, and BBSD)
Ft minimum feature size of technology node for TFT layer
Fc minimum feature size of technology node for CMOS circuitry layer
J, J11-J33 magnetic tunnel junction
K, K11-K33 . . . KNM (memory element) magnetic tunnel junction and semiconductor layer comprising a portion of a back to back Schottky diode
M—number of Word lines in a memory array
N—number of Bit lines in a memory array
MTJ—magnetic tunnel junction
SA1-SA3 . . . SAM sense amplifier
TFT—thin film transistor
Tb1-Tb6 . . . Tb(N×2) bit line transistor
Ts1-Ts3 . . . TsM read transistor
Tw1-Tw6 . . . Tw(M×2) word line transistor
WL, WL1, WL2, WL3 . . . WLM word line

BACKGROUND

Nonvolatile cross-point memory technologies such as Resistance random access memory (ReRAM) and Magnetic random access memory (MRAM) using magnetic tunnel junctions (MTJs) are strong candidates for providing a dense and fast non-volatile storage solution for future memory applications.

A conventional MTJ includes at least a pinned ferromagnetic layer and a free ferromagnetic layer separated from each other by a thin tunnel barrier layer. The free layer has a reversible magnetization direction that can have two stable directions that are parallel or anti-parallel to a fixed magnetization direction of the pinned layer. Resistance of the MTJ depends on the mutual orientation of the magnetizations in the free and pinned layers and can be effectively controlled.

A typical MRAM device includes an array of memory cells, a plurality of parallel word lines extended along columns (or rows) of the memory cells, and a plurality of parallel bit lines extended along rows (or columns) of the memory cells. The word and bit lines overlay each other but spaced from each other in a vertical direction. Each memory cell is located at a cross-point of a word line and a bit line, and typically includes a single MTJ connected in series with a selection metal-oxide-semiconductor (MOS) transistor. The connected in series MTJ and transistor are electrically coupled to the word line at one terminal and to the bit line at the opposite terminal.

FIG. 1 shows a circuit diagram for a magnetic random access memory (MRAM) array according to a prior art disclosed in U.S. patent application publication US 2012/

0281465. U.S. patent application publication US 2012/0281465 discloses in detail various methods of writing bits ("0" and "1") to the memory cells as well as reading and erasing the bits. The disclosure of US 2012/0281465 is hereby incorporated in its entirety by reference.

FIG. 2 shows a cross sectional view of a magnetic memory cell made with perpendicular magnetic materials according to the prior art.

The circuit described by US 2012/0281465 presents a challenge to controlling the addressing of the memory array for writing, reading or erasing due to the fact alternative current paths are possible than those described in the disclosure. This problem is also described in U.S. Pat. Nos. 7,968,419 and 8,227,788, which teach the use of back to back Schottky diodes in a resistance memory array to solve the cross talk problems associated when reading from the array. FIG. 3 is a circuit diagram of a crosspoint resistance non-volatile memory array including resistance variable elements 105 with back to back Schottky diodes (referred to as current controlling elements) 112 according to U.S. Pat. No. 8,227,788. Word and bit conductive lines are indicated at 101 and 119.

US 2012/0281465 describes location of the selection transistors positioned along the perimeter of the array which still requires valuable die area. The use of MOS transistors as a selection element limits the arrangement of the existing MRAM into three-dimensional configuration due to long interconnects to the selection transistor from the remote layers of MTJs. Moreover, the MOS technology is relatively expensive.

An improved method of addressing the word and bit selection transistors in MRAM memory arrays is required that retains the advantages of small die size due to the cross-point design of the memory array and eliminates the MOS transistors altogether to enable lower cost.

The present application addresses the above problems and provides a solution for low cost three-dimensional non-volatile cross-point memory arrays.

DISCLOSURE OF THE INVENTION

An improved memory device comprising a substrate, a plurality of memory arrays disposed above the substrate surface, each memory array being arranged in a matrix and comprising a plurality of parallel first conductive lines, a plurality of parallel second conductive lines overlapping the first conductive lines at a plurality of intersection regions, a plurality of memory cells, each memory cell being disposed at an intersection region of the conductive lines, electrically coupled to one of the first conductive lines at a first terminal and to one of the second conductive lines at a second terminal, and comprising a controllable electrical resistance, wherein a back to back Schottky diode is located between each memory cell and one of the said conductive lines, and wherein each conductive line is electrically coupled to at least two thin film transistors (TFTs). The device is substantially produced in BEOL facilities without need of front end semiconductor production facilities, yet can be made with ultra high density and low cost. Furthermore, the device can be produced as an embedded memory on layers directly above a semiconductor circuit (for example in an ASIC, FPGA or microprocessor chip) providing even lower cost and easy, fast access to non-volatile memory without having to go off chip. TFTs may be fabricated in single or multiple layers of arrays providing flexibility to the designer for optimizing cost, performance or other design objectives.

The magnetic tunnel junction (MTJ) element herein mentioned in this specification and within the scope of the claims is a general term of a tunneling magnetoresistance element using an insulator or semiconductor as the tunnel barrier layer. Although the above mentioned figures each illustrate the major components of the MTJ element, another layer (or layers) such as a seed layer, a pinning layer, a cap layer, and others may also be included.

The use of back to back Schottky diodes in nonvolatile memory arrays has been disclosed by Mikawa (U.S. Pat. No. 8,227,788) and Li (U.S. Pat. No. 7,968,419) for resistance random access memory (ReRAM) and by Agan, in co-pending patent application No. 61/702,485, by one of the inventors (Agan), for magnetic random access memory (MRAM). The disclosures of U.S. Pat. Nos. 8,227,788 and 7,968,419 and U.S. patent application 61/702,485 are hereby incorporated in their entirety by reference. A back to back Schottky diode is a metal/semiconductor/metal (MSM) structure, commonly made from silicon (Si) semiconductor material, although other semiconductor materials may be used such as Zinc oxide (ZnO) or Indium Gallium Zinc Oxide (IGZO). The back to back Schottky diode has a threshold voltage, breakdown voltage, and on/off current ratio.

FIG. 6. shows a circuit diagram of a portion of a cross-point MRAM array 30 according to embodiments of the present disclosure. The memory includes an array 22 of memory cells C11-CNM, a plurality of parallel bit lines BL1-BLN connected at their end to a bit line driver 24, and a plurality of parallel word lines WL1-WLM connected at their end to word line driver 26.

Each memory cell comprises an MTJ element and a back to back Schottky diode (BBSD), without a selection transistor. The MTJ element and semiconductor layer of the BBSD (together referenced as K) is connected to the appropriate bit and word lines at its ends and disposed at the intersection of the lines in a vertical space between them. Representative schematic views of a memory cell of the MRAM 30 is shown on FIG. 4A and 4B. The MTJ element J has a pillar structure and comprises at least a pinned magnetic layer 12 having a fixed magnetization direction (shown by a solid arrow), a free magnetic layer 16 having a variable (or reversible) magnetization direction (shown by a dashed arrow), and a tunnel barrier layer 14 disposed between the pinned and free magnetic layers. A semiconductor material, such as Silicon (Si), 18, is disposed between the Word line WL and free magnetic layer 16; this metal-semiconductor-metal (MSM) structure is a back to back Schottky diode, BBSD.

The free magnetic layer 16 can be made of a magnetic material with a substantial spin-polarization and has a magnetization directed substantially perpendicular to a layer surface in its equilibrium state. For example, the free magnetic layer 16 can be made of $(Co_{30}Fe_{70})_{85}B_{15}$ (% atomic) alloy having a thickness of about 1.5 nm. The pinned magnetic layer 12 can be made of a magnetic material with a substantial spin-polarization and has the magnetization directed substantially perpendicular to a layer surface. For example, the pinned magnetic layer can be made of the $(Co_{30}Fe_{70})_{85}B_{15}$ (% atomic) alloy having a thickness of about 2.5 nm. The tunnel barrier layer 14 can be made of MgO having a thickness of about 1.1 nm. The free, tunnel barrier and pinned layers form a substantially coherent texture having a BCC (body-centered cubic) structure with (001) plane orientation. The MTJ element with this crystalline structure provides a substantial tunneling magnetoresistance (TMR≥100% at room temperature) and a density of spin-polarized write current of about $1 \cdot 10^6$ A/cm² or less. These parameters are essential for MRAM.

In the MRAM 30 shown in FIG. 6 the pluralities of the conductive bit and the word lines intersect each other but are spaced from each other in direction perpendicular to a plane of substrate (not shown). Each of the memory cells C11-CNM comprises an appropriate MTJ element and semiconductor layer (K11-KNM) that is disposed at an intersection of a bit and word line in the vertical space between them. The memory element K is electrically connected to the intersecting bit and the word lines at its opposite ends. For instance the memory cell C22 comprises the memory element K22 disposed at the intersection of the bit line BL2 and the word line WL2. The memory element K22 is electrically connected to the word line WL2 at its first end and to the bit line BL2 at its second end.

The bit lines BL1-BLN extend in the X-direction. They are electrically connected to a bit line driver 24 that includes transistors Tb1-Tb(N×2), which may be CMOS transistors or thin film transistors (TFTs). Each bit line is connected to two transistors which control the magnitude and direction of the current. Although FIG. 6 schematically indicates the bit line driver 24 transistors are connected at the end of the bit lines BL1-BLN, this is not required and in particular, it is preferred to provide for the physical interconnects between the bit lines BL1-BLN and bit line driver transistors Tb1-Tb(N×2) at various points along the bit lines in order to minimize the interconnect complexity of the device. This is an important aspect of the invention, enabling the interconnect of small technology node bit lines to larger technology node transistors arranged above or below the entire area of the memory array. Shorter interconnects are preferable since they enable higher speed operation.

The bit driver 24 operates as a row selection switch. The bit driver 24 and related transistors are connected with signal lines (not shown) to bandgap and decoder logic, which is comprised of additional transistors which may or may not be located on the same layer of the bit line transistors. It is preferred that the decoder logic and bandgap transistors are on the same layer of the related bit driver transistors in order to provide for shorter interconnects and hence, higher speed operation and lower cost due to simpler construction.

The word line WL1-WLM extend in the Y-direction crossing the X-direction. Each word line WL1-WL3 is connected to the word line driver 26. Although FIG. 6 schematically indicates the word line driver 26 transistors are connected at the end of the word lines WL1-WLM, this is not required and in particular, it is preferred to provide for the physical interconnects between the word lines WL1-WLM and word line driver transistors Tw1-Tw(M×2) at various points along the word lines in order to minimize the interconnect complexity of the device. This is an important aspect of the invention, enabling the interconnect of small technology node word lines to larger technology node transistors arranged above or below the entire area of the memory array. Shorter interconnects are preferable since they enable higher speed operation.

The driver 26 comprises a plurality of read/write circuits. Each of the read/write circuits includes at least a pair of transistors Tw1-Tw(M×2) connected in series to each other, and one of a sense amplifiers SA1-SAM. Each word line WL1-WLM is connected to two transistors which control the magnitude and direction of the current. The word line is further connected to a common drain terminal of the transistor pair and to one input terminal of the sense amplifier SA through a read transistor Ts. For example, the word line WL2 is connected to the common drain terminal formed on the transistor pair Tw3 and Tw4 and to the first input terminal of the sense amplifier SA2 through the read transistor Ts2. A second input terminal of the sense amplifier SA2 is connected to a reference element (not shown). Gates of the transistors Tw1-Tw(M×2) are connected to the word line driver 26. The word driver 26 operates as a column selection switch. The word driver 26 and related transistors are connected with signal lines (not shown) to bandgap and decoder logic, which is comprised of additional transistors which may or may not be located on the same layer. It is preferred that the decoder logic and bandgap transistors are on the same layer of the related word driver transistors in order to provide for shorter interconnects and hence, higher speed operation and lower cost due to simpler construction.

Each of the sense amplifiers SA1-SAM comprise at least two inputs. One input of the amplifier is connected to the word line WL1-WLM and to the common drain terminal of the transistor pair by means of the read transistor Ts1-TsM. The other input of the sense amplifier is connected to a reference element (not shown). The sense amplifier judges a data value of the MTJ element inside of the selected memory cell based on a reference signal.

The memory 30 shown in FIG. 6 comprises the array 22 of the memory elements K11-KNM disposed above the substrate (not shown). The selection transistors Tb1-Tb(N×2) and Tw1-Tw(M×2) may be positioned along a perimeter of the array 22, but are preferably fabricated on another layer above or below the memory array and positioned across the entire area of the array to minimize the interconnect complexity of the device. This enables the multiplexing of ultra large size M x N memory arrays. This approach, including layering in three dimensions of several memory arrays and thin film transistor (TFT) arrays optimizes the die area and provides for maximum memory density in terms of bits per area.

Larger size TFTs made with larger technology node Ft relative to the technology node of the MTJ layer Fm, provides for cost savings since such process equipment is significantly lower in cost compared to that required for CMOS transistors. Even in the domain of TFT transistor production, larger technology node processing is less expensive than smaller technology node processing. Larger transistors also can provide a substantial write current that is essential for high speed writing.

The MRAM 30 shown in FIG. 6 employs a spin-induced switching mechanism of the memory elements K. According to spin-induced switching the orientation of magnetization in the free layer 16 can be reversed by a spin-polarized current $I_S$ (not shown) running through the memory element. Electrons of the write current have a substantial degree of spin polarization that is predetermined by magnetic properties of the pinned layer 12. The spin-polarized electrons running through the free layer 16 transfer a moment of their spin causing the magnetization in the free layer to change its direction. Direction of the magnetization in the free layer 16 can be controlled by a direction of the spin-polarized current $I_S$ running through the memory element. The direction of the spin-polarized current in the memory element corresponds to writing a logic "0" or to parallel orientation of magnetization directions in the free 16 and pinned 12 magnetic layers.

In order to write a logic "0" to a memory element (K22 of the memory cell C22 for example) a switching current $I_S$ (not shown) is produced in the memory element by applying appropriate input signals to the gate of the transistor Tb4 and to the gate of the transistor Tw3. Both transistors are opened. The spin-polarized current $I_S$ is running from the power supply (not shown) through the transistor Tb4, bit line BL2, memory element K22, word line WL2, and transistor Tw3 to the ground. For the memory element having a configuration shown in FIG. 4A the current $I_S$ is running in the direction from the free layer 16 to the pinned layer 12 through the tunnel barrier layer 14. The spin-polarized conductance electrons are moving in the opposite direction from the pinned layer 12 to the free layer 16. For the given direction of the current $I_S$, the magnetization in the free layer 16 will be directed in parallel to the magnetization direction of the pinned layer 12. This mutual orientation of the magnetizations corresponds to a low resistance state of the memory element or to a logic "0". There is a minimum threshold voltage required, due to the back to back Schottky diode (BBSD) structure, for this operation to occur.

In order to write a logic "1" to a memory element (K22. of the memory cell C22 for example) a write current $I_S$ (not shown) is supplied to the memory element K22 by simultaneously applying an appropriate input signal to the gate of the transistors Tb3 and Tw4. The transistors are opened and the current $I_S$ is running from the transistor Tw4 to the transistor Tb3 through the word line WL2, memory element K22, and bit line BL2. In the memory element K22 having a configuration shown in FIG. 4A the spin-polarized current $I_s$ is running in the direction from the pinned layer 12 to the free layer 16. This direction of the spin-polarized current can direct the magnetization in the free layer 16 anti parallel to the magnetization direction of the pinned layer 12. This mutual orientation of the magnetizations corresponds to a high resistance state or to a logic "1". There is a minimum threshold voltage required, due to the back to back Schottky diode (BBSD) structure, for this operation to occur.

A major advantage of using TFTs is that multiple layers of memory arrays can be fabricated with layers of TFTs between such memory layers to provide for very high density memory devices.

With regard to digital integrated circuits, process technology refers to the particular method used to make silicon chips. The driving force behind the manufacture of integrated circuits is miniaturization, and process technology boils down to the size of the finished transistor and other components. A certain feature size of a process technology is also referred to as a "technology node" or "process node". Higher density memory arrays are possible using cross-point architectures and manufactured at smaller size technology nodes. State of the art process technology nodes have evolved with technology improvements in semiconductor processing from 1,000 nm in 1985, to 180 nm in 1999, to 45 nm in 2008, to 22 nm in 2012, and 14 nm expected to come on line in 2014. By 2020, 7 nm process technology nodes are expected to be available.

A key advantage of the present invention is that the technology nodes for fabrication of the memory array (MTJ layer) and TFT array (TFT layer) are decoupled. In other words, depending on the desired functionality of the TFT layer, one may use the same technology node (for example, 45 nm) used to fabricate the MTJ layer to fabricate the TFTs, or preferably, in order to reduce cost and given the fact there is a significantly smaller number of TFTs needed (($2 \times N$)+($3 \times M$)) compared to the number of memory elements (M×N), a larger technology node (for example, 65 nm, 90 nm, 130 nm or larger yet) may be employed during the fabrication of the TFTs. In addition, there is no need to place the TFTs along the perimeter of the memory array as disclosed in US 2012/0281465; rather, the TFTs are fabricated directly over or under the memory array to be addressed. Interconnection of the TFTs to their respective conductive lines is done vertically with no need for complex lateral interconnects. TFTs do not require the front end process equipment required in MOS foundries; hence, the cost of TFTs are substantially lower than MOS based transistors. Eliminating the need for MOS based transistors allows for use of low cost glass substrates.

The selection thin-film transistors can be disposed below or above magnetic tunnel junctions (or junctions). A gate width of the selection transistor can be significantly larger that a width (or a diameter) of the magnetic tunnel junction. A memory cell can have one transistor—several magnetic tunnel junctions (1T-nMTJ) arrangement. The magnetic tunnel junctions are jointly electrically connected to a selection transistor at their first ends and independently electrically coupled to an appropriate conductive line (bit or word line) at their second ends. A data can be recorded to magnetic tunnel junction by a spin-induced switching mechanism or by a hybrid switching mechanism including simultaneous effect of the spin-polarized current and a bias magnetic field applied to the magnetic tunnel junction.

FIG. 10 is a top view illustration showing the interconnects of conductive lines (either bit lines or word lines) at various intermediate points to allow for simple connection to an array of large transistors formed across a large area. The figure is intended to convey the fact that although the area required to fabricate a TFT is much larger than the area of a memory cell, the TFTs may be arranged across an area above or below the MTJ layer such that interconnects between conductive lines fabricated at Fm technology node are connected to TFT terminals fabricated at Ft technology node without requiring complex lateral interconnect wiring. A TFT terminal need only connect at a portion of a conductive line and the TFTs may be arranged in a manner to minimize disconnects due to alignment challenges arising from the much larger process technology node used to fabricate the TFT layer compared to that of the MTJ layer.

FIG. 11A and 11B further illustrates the advantages of the present invention with respect to decoupling of the process technology nodes—Fm and Ft—in fabrication of the memory array layer, including BBSD and conductive lines, (the MTJ layer) and TFT array (the TFT layer). As described in the embodiments below there are many configurations that a designer may choose to place transistors on the various TFT layers disclosed herein. FIG. 11A and 11B is for one configuration only, namely that of the third embodiment where a single layer TFT array may have at least 2N transistors to provide the bit driver circuitry for an MTJ layer.

A typical size (area) for a TFT is $12Ft^2$ (T). The size (area) of a cross-point memory cell is $4Fm^2$. For a given matrix or memory block consisting of M×N cells (bits), the area required is M×N×$4Fm^2$. To consider the area required on a TFT layer which interconnects to the bit conductive lines, 2×N TFTs (select transistors) are required. The area required for the TFTs (assuming typical area of $12Ft^2$ per TFT) is equal to 24 $Ft^2$×N. Calculating an equivalent area for both the MTJ layer and TFT layer would provide the maximum Ft for a given matrix of M word lines at a given Fm technology node for the memory cells. Hence, For M×N×$4Fm^2$ (MTJ layer area)=24 $Ft^2$×N (TFT layer area), yields Ft(max)=Square root of (M×$Fm^2$/6)

Taking Fm=45 nm for example, and a matrix of 100 word lines, the maximum Ft=184 nm. Assuming M=N, a memory block of 100×100 (10 Kbits), would occupy a square area about 9 microns×9 microns. As noted, it is preferable to also include transistors for the decoder logic and bandgap logic in close proximity to the selection transistors. Hence, a designer may elect Ft=130 nm (approximately 288%×Fm) which would provide for up to double the number of transistors in the same space as Ft=184 nm would provide for. It should be noted that in practice 184 nm is not an available process technology node; however, 180 nm is. The intent of FIG. 11A and FIG. 11B is to illustrate how by decoupling the technology nodes required for the MTJ layer from the TFT layer, a wide range of flexibility is available to the designer to select a technology node that optimizes the parameters most important to the product design—whether it be cost, speed, density, or power. Staying with Fm=45 nm, if M=1,000 (1 Mbit memory block assuming M=N), the maximum Ft= 581 nm (>1000%×Fm).

The process technology node of 45 nm was introduced in 2008. If one looks at Fm=7 nm (a technology node expected to be available by 2020), and M=10,000, Ft max=286 nm (assuming a TFT area of 12Ft² remains the typical size). A memory block, if M=N is assumed, would have 100 Mbits, occupying an area of 140 microns×140 microns. This is equivalent to about 400 GBytes per square inch. With five (5) MTJ layers, a 2 Terabyte per square inch device could be fabricated, substantially in BEOL facilities, with word and bit driver select transistors, read transistors and decoder logic transistors all included and fabricated at a low cost technology node of 180 nm or 130 nm.

It should be noted herein that the terms "TFT layer" and TFT-L1, TFT-L2, TFT-L3 . . . TFT-Ln used herein in the figures and embodiment descriptions may refer to a single layer TFT array or several layers of TFT arrays. FIG. 11A and FIG. 11B calculations assume a single layer TFT array. However, one may design and fabricate more than one layer of TFTs, which would enable one to use a larger technology node compared to a single layer TFT array. Alternatively, the same technology node but more layers of TFTs provide for more number of transistors that can be placed in the given area. This allows for flexibility in design. For example, FIG. 11B indicates that even at a relatively small sized memory array (M=10), max. Ft is larger than Fm, indicating that TFT drive circuitry for even small sized memory arrays may reside above or below the memory array in the same area. This could be accomplished at the same or slightly larger technology node used for Fm as Ft, or one may add one or more additional layers of TFTs which would relax the technology node requirement and enable larger less expensive technology node TFTs to be fabricated. This could be beneficial for certain embedded memory designs. Design of metal layer interconnects between TFT layers and connection between TFT terminals and conductive lines of the MTJ layers is a known art and hence the figures and description herein is intended to be illustrative only, with detailed drawings of such interconnects not needed.

BRIEF DESCRIPTION OF THE DRAWINGS

FIG. 11B is an illustration showing the range of maximum technology nodes for the TFTs as a function M and Fm, assuming a TFT cell area of 12Ft² for one configuration only

BEST MODE TO CARRY OUT THE INVENTION

Figure 1:
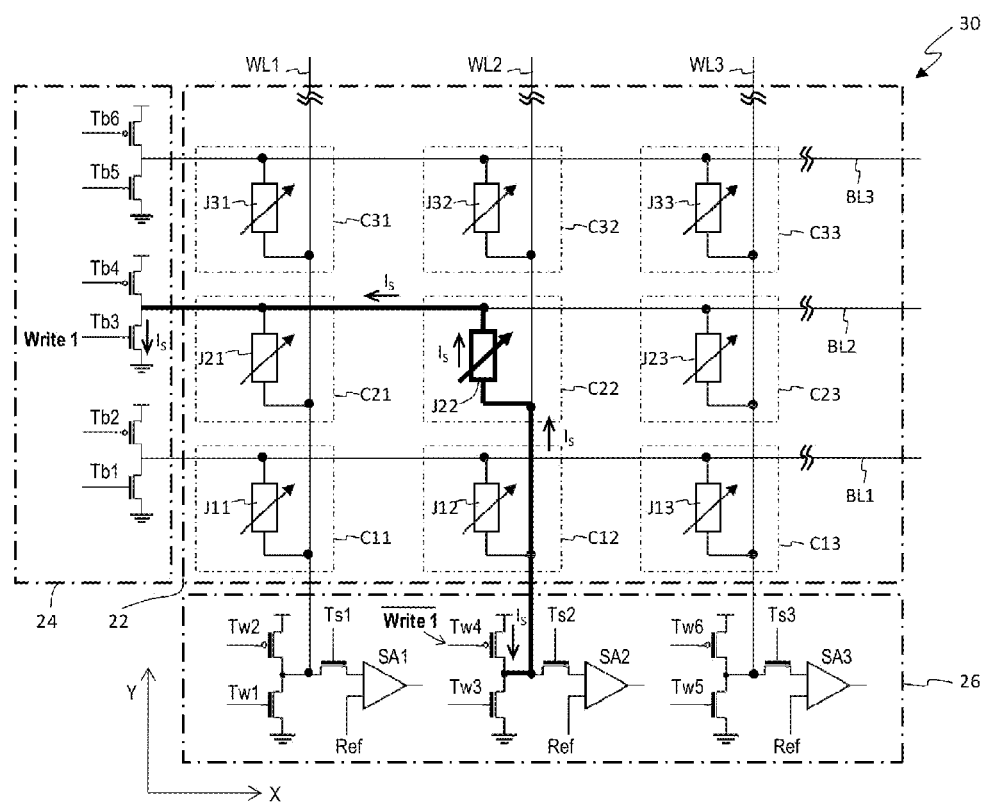
FIG. 1 is a circuit diagram of a memory array according to the prior art.
Figure 2:
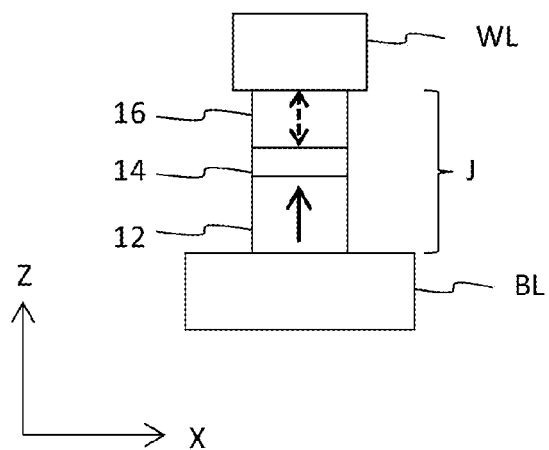
FIG. 2 is a cross section view of a magnetic memory cell made with perpendicular magnetic materials according to the prior art.
Figure 3:
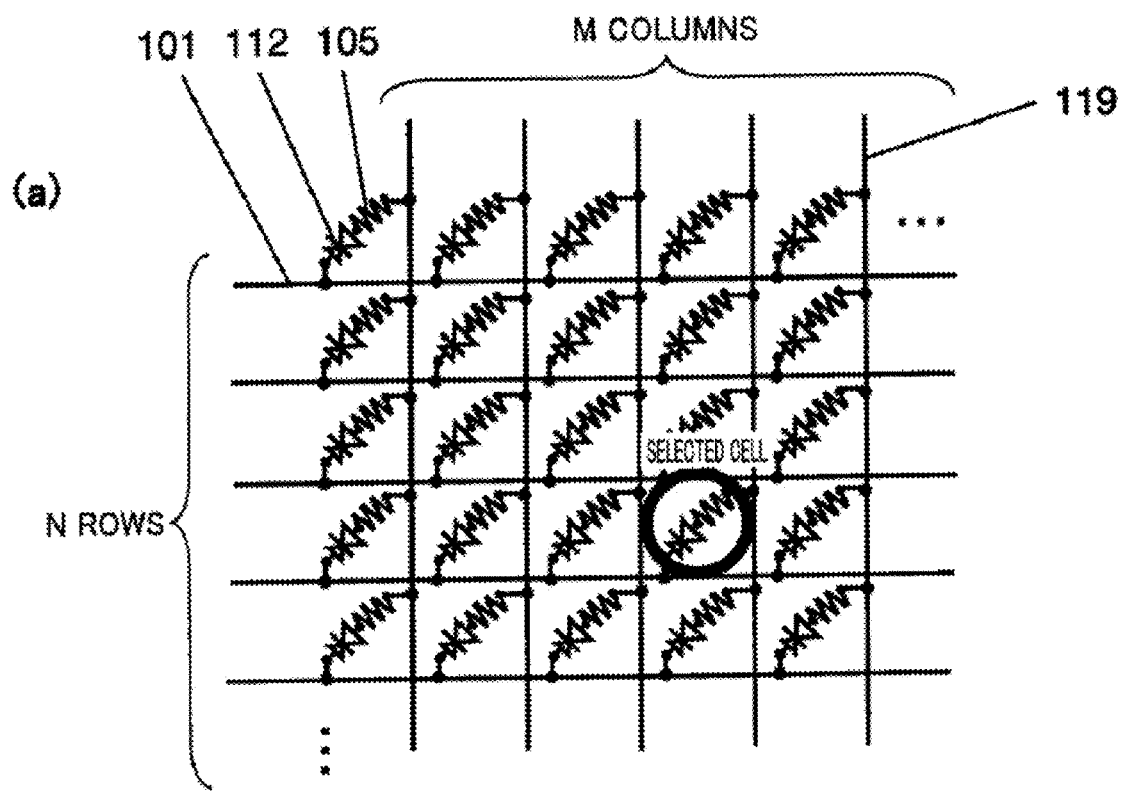
FIG. 3 is a circuit diagram of a crosspoint resistance nonvolatile memory array with back to back Schottky diodes at each memory cell according to the prior art
Figure 4A:
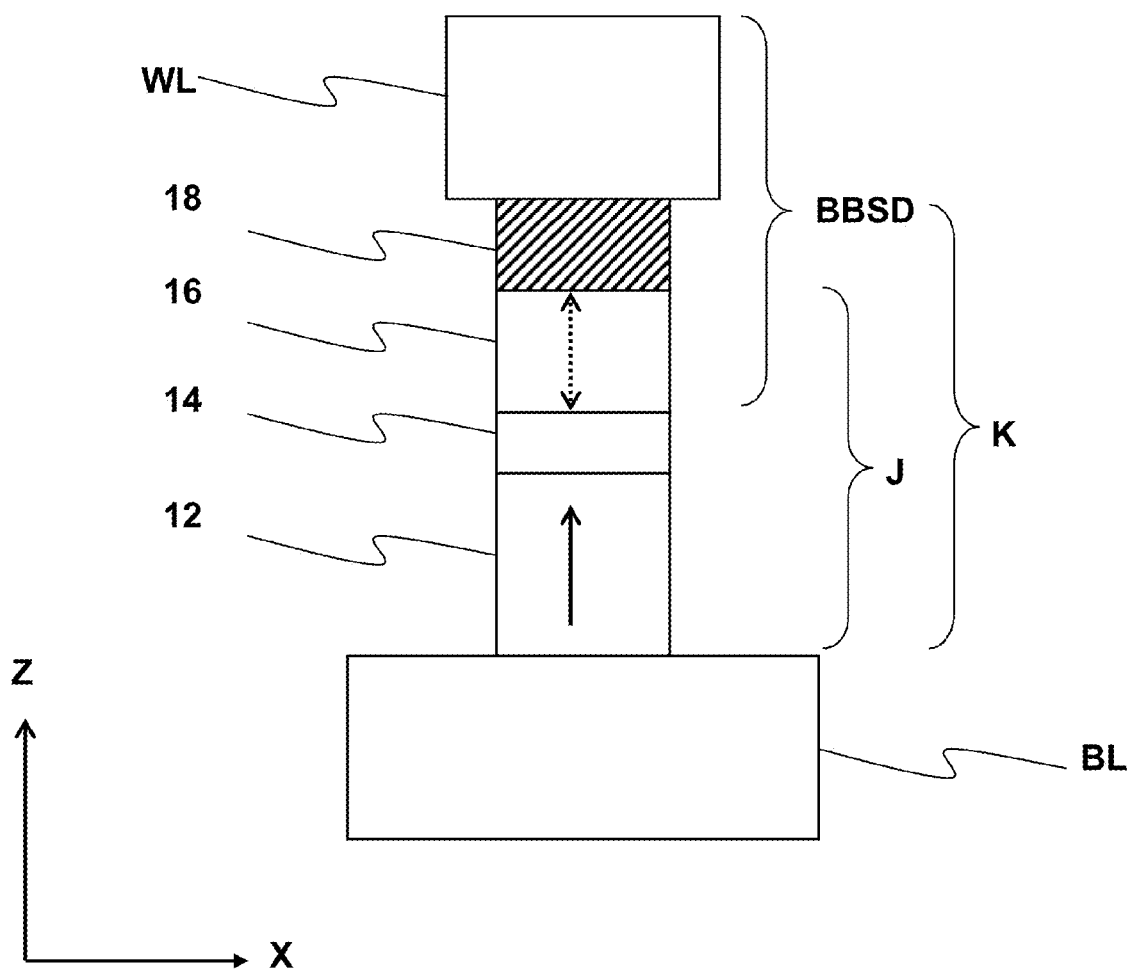
FIG. 4A and 4B are cross sectional views of a magnetic memory cell made with perpendicular magnetic materials including a back to back Schottky diode built into the structure
Figure 4B:
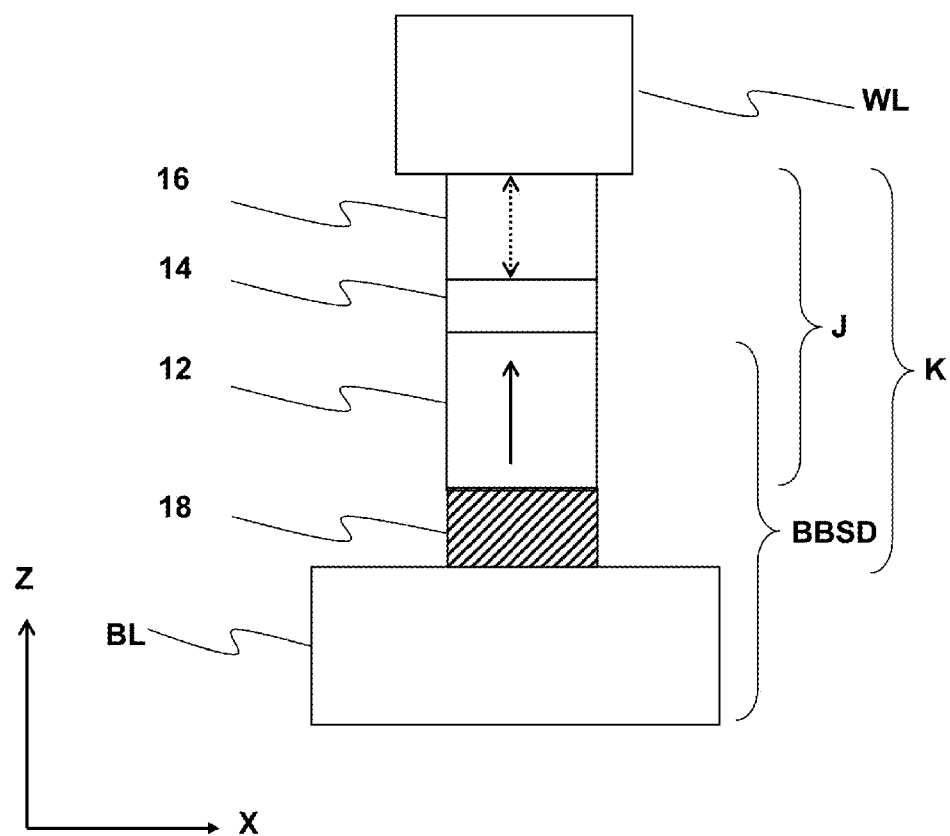

The best mode for carrying out the invention is presented in terms of the first, second and third embodiments disclosed.

Embodiments of the present disclosure will be explained below with reference to the accompanying drawings. Note that in the following explanation the same reference numerals denote constituent elements having almost the same functions and arrangements, and a repetitive explanation will be made only when necessary.

Note also that each embodiment to be presented below merely discloses a device or method for embodying the technical idea of the present disclosure. Therefore, the technical idea of the present disclosure does not limit the materials, structures, arrangements, and the like of constituent parts to those described below. The technical idea of the present disclosure can be variously changed within the scope of the appended claims.

First Embodiment

Figure 6:
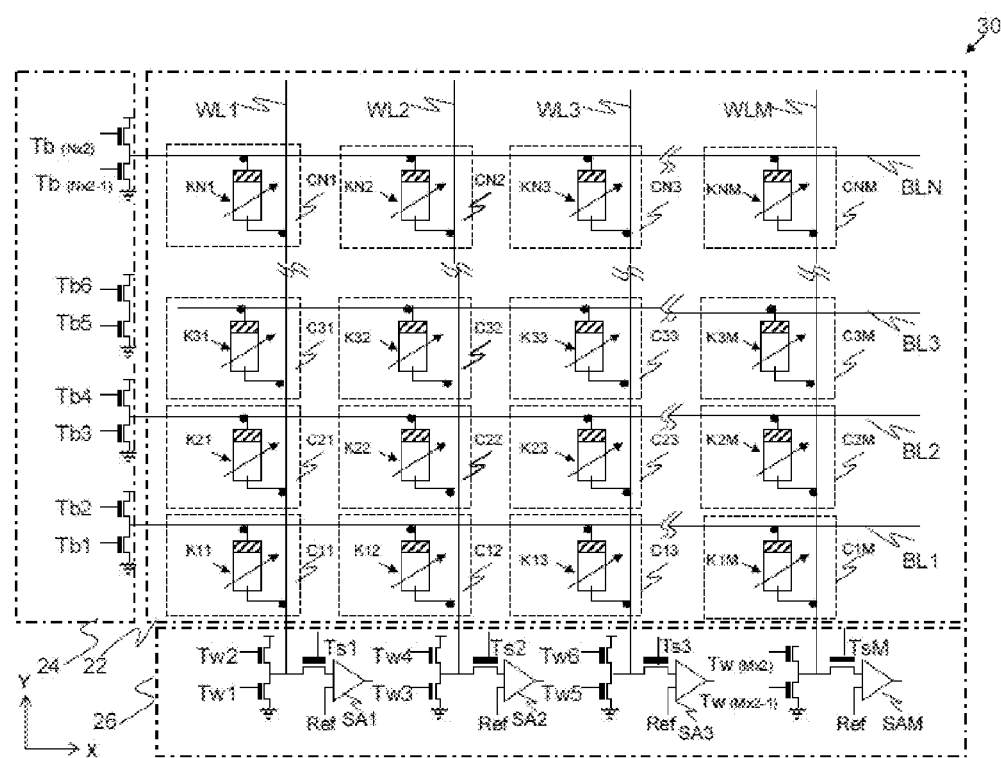
FIG. 6 is a circuit diagram of a magnetic random access memory (MRAM) cross-point array with back to back Schottky diodes at each memory cell
Figure 7:
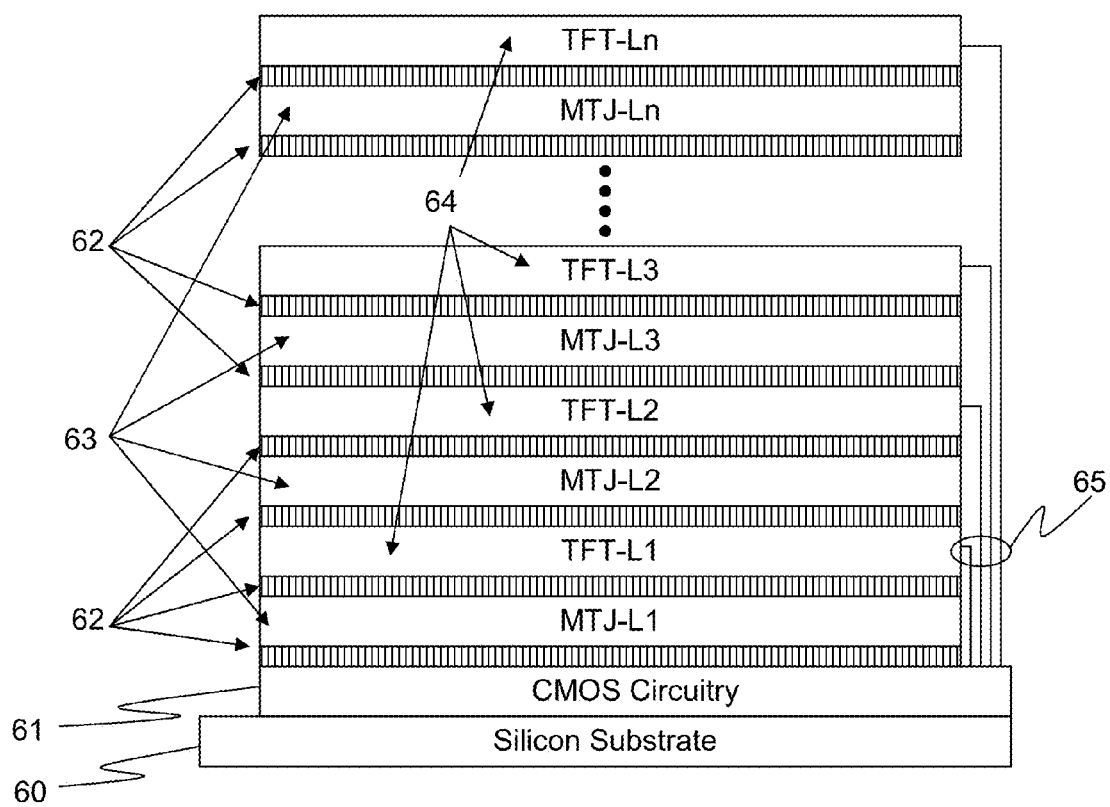
FIG. 7 is a cross section view of a three-dimensional memory array made in accordance with a first embodiment of the present invention
Figure 10:
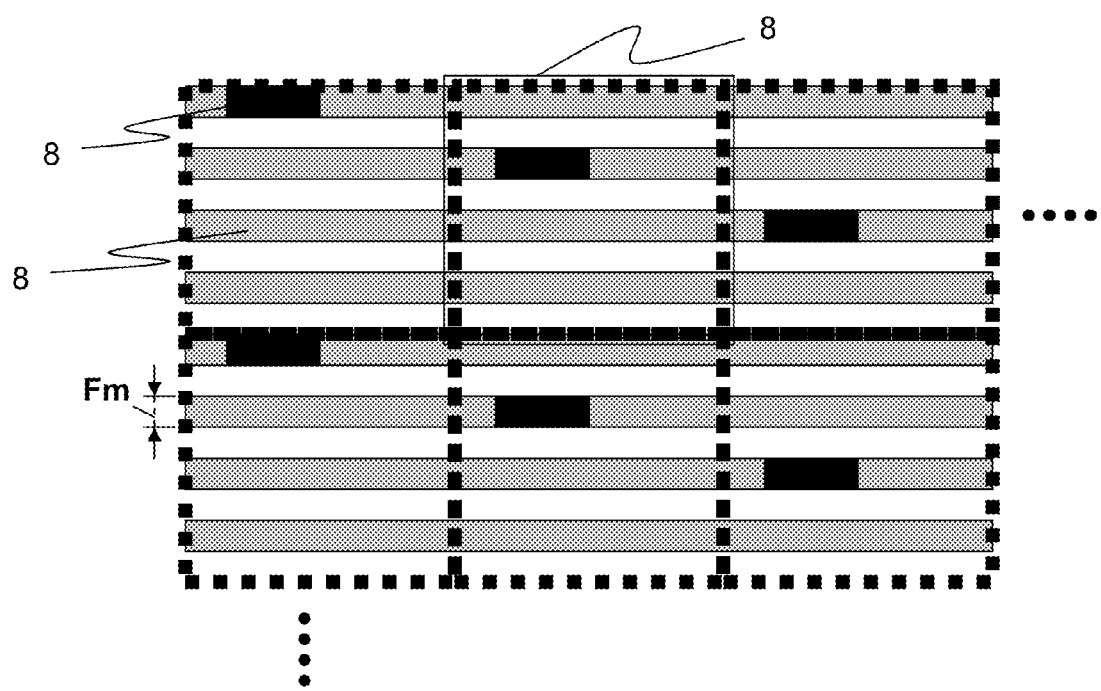
FIG. 10 is a top view illustration showing the interconnects of conductive lines (either bit lines or word lines) at various intermediate points to allow for simple connection to an array of large transistors formed across a large area FIG. 11A

FIG. 7 is a cross section view of a three-dimensional memory array made in accordance with a first embodiment of the present invention. Memory arrays (63) are cross-point MRAM arrays made according to FIG. 6 whereby a BBSD is incorporated into each memory element. A silicon wafer substrate (60) is provided with CMOS circuitry (61) fabricated on the substrate. Such circuitry is fabricated at a technology node (Fc) which may be the same size as the technology node for the MTJ layers (Fm) or smaller or larger, depending on the nature of the CMOS circuitry. For example, a microprocessor or high end FPGA may be fabricated at a smaller technology node Fc compared to the embedded memory array (Fm) which resides above the circuitry. This embedded memory is lower cost than a separate chip and provides for higher speeds as no off chip delays a required. Lower power consumption is also realized due to the reduced circuitry. On the other hand, a stand alone memory device may have a larger technology node Fc compared to the technology node of the memory array (Fm). In a dedicated memory device, high density is critical for low cost; hence the technology node of the memory array (Fm) would be as small as possible, whereas the CMOS circuitry would be relatively less complex compared to a microprocessor and hence, for lower cost, could be fabricated at a technology node (Fc) larger than the technology node of the memory array (Fm). Such circuitry may include the bandgap and decoder logic for the memory arrays (63), as well as selection transistors for the first memory array (MTJ-L1). Additional circuitry for the memory arrays (MTJ-L1-MTJ-Ln) is provided in various layers (64) of thin film transistors (TFT-L1-TFT-Ln) disposed between the memory arrays. The TFT circuitry is fabricated at a technology node (Ft) substantially larger than Fm, such as 40% to 1,000% larger than Fm. Interconnect layers (62) are fabricated at technology node Fm to provide for interconnection of the word and bit lines to the respective word driver and bit driver circuitry. The placement of the relatively large thin film transistors across a large area, as indicated in FIG. 10, enables interconnection to the bit and word lines not at the end of such lines, but at various intermediate points along the lines, thereby minimizing the complexity of interconnection. Additional interconnects (65) are made from one or more TFT layers to related bandgap and decoder logic (not shown) which may or may not reside on the CMOS circuitry layer. Preferably, bandgap and decoder logic transistors are located on the same layer or in close proximity to the respective bit or word selection transistors in order to provide for shorter interconnects, which provides for higher speed operation and lower cost due to lower complexity of construction, in which case such transistors would be on the TFT layer. A TFT layer preferably includes both word driver circuitry for an MTJ layer either above or below it, and bit driver circuitry for an MTJ layer either above or below it. For example, TFT-L1 could include the bit driver transistors for MTJ-L1 and the word driver transistors for MTJ-L2; TFT-L2 could include the bit driver transistors for MTJ-L2 and the word driver transistors for MTJ-L3; and so forth. The word driver transistors for MTJ-L1 would reside on the CMOS circuitry layer. In this case, each TFT layer, except the top layer, TFT-Ln, would include at least (M×3)+(N×2) transistors, plus additional transistors if decoder and bandgap logic circuitry resides on the TFT layer.

Second Embodiment

Figure 8:
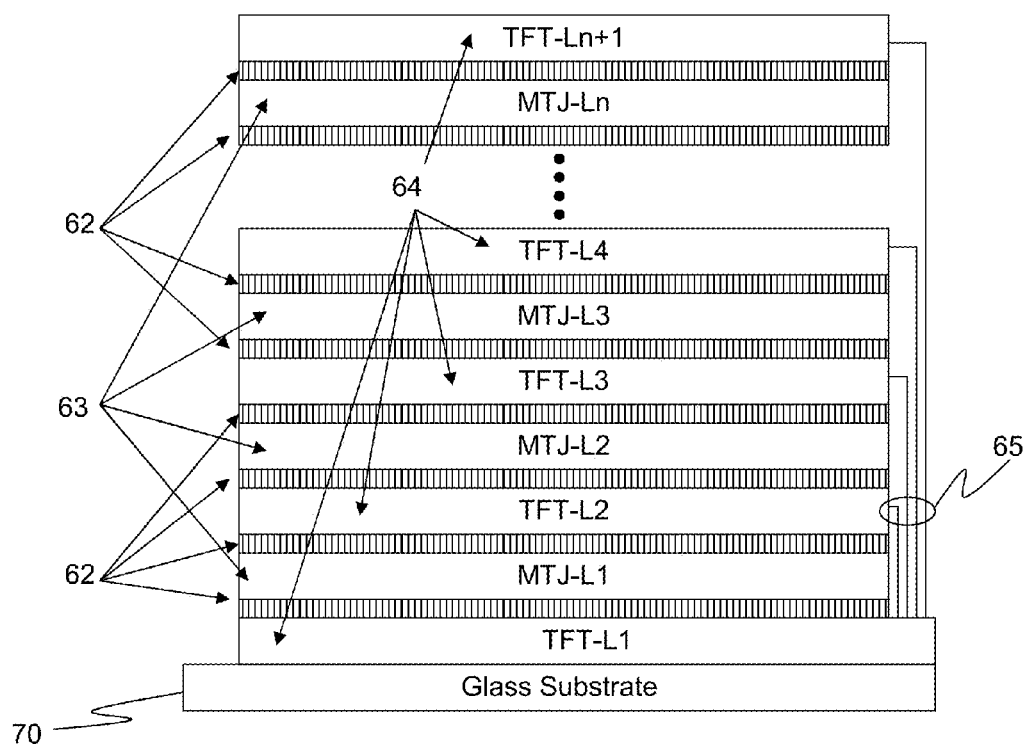
FIG. 8 is a cross section view of a three-dimensional memory array made in accordance with a second embodiment of the present invention

FIG. 8 is a cross section view of a three-dimensional memory array made in accordance with a second embodiment of the present invention. Memory arrays (63) are cross-point MRAM arrays made according to FIG. 6 whereby a BBSD is incorporated into each memory element. A low cost glass substrate (70) is provided with the first thin film transistor layer (TFT-L1) circuitry fabricated on the substrate. Such circuitry is fabricated at a technology node (Ft) which may be the same size as the technology node for the MTJ layers (Fm) but preferably for cost savings may be larger than Fm. Such circuitry may include the bandgap and decoder logic for the memory arrays (63), as well as selection transistors for the first memory array (MTJ-L1). Additional circuitry for the memory arrays (MTJ-L1-MTJ-Ln) is provided in various additional layers (64) of thin film transistors (TFT-L2-TFT-Ln+1) disposed between the memory arrays. The TFT circuitry is fabricated at a technology node (Ft) substantially larger than Fm, such as 40% to 1,000% larger than Fm. Interconnect layers (62) are fabricated at technology node Fm to provide for interconnection of the word and bit lines to the respective word driver and bit driver circuitry. The placement of the relatively large thin film transistors across a large area, as indicated in FIG. 10, enables interconnection to the bit and word lines not at the end of such lines, but at various intermediate points along the lines, thereby minimizing the complexity of interconnection. Additional interconnects (65) are made from one or more TFT layers to related bandgap and decoder logic (not shown) which may or may not reside on the TFT-L1 circuitry layer. Preferably, bandgap and decoder logic transistors are located on the same layer or in close proximity to the respective bit or word selection transistors in order to provide for shorter interconnects, which provides for higher speed operation and lower cost due to lower complexity of construction, in which case such transistors would be on the TFT layer. A TFT layer preferably includes both word driver circuitry for an MTJ layer either above or below it, and bit driver circuitry for an MTJ layer either above or below it. For example, TFT-L1 could include the word driver transistors for MTJ-L1; TFT-L2 could include the bit driver circuitry for MTJ-L1 and the word driver transistors for MTJ-L2; TFT-L3 could include the bit driver transistors for MTJ-L2 and the word driver transistors for MTJ-L3; and so forth. In this case, each intermediate TFT layer (excluding the bottom and top layer) would include at least (M×3)+(N×2) transistors, plus additional transistors if decoder and bandgap logic circuitry resides on the TFT layer.

Third Embodiment

Figure 5:
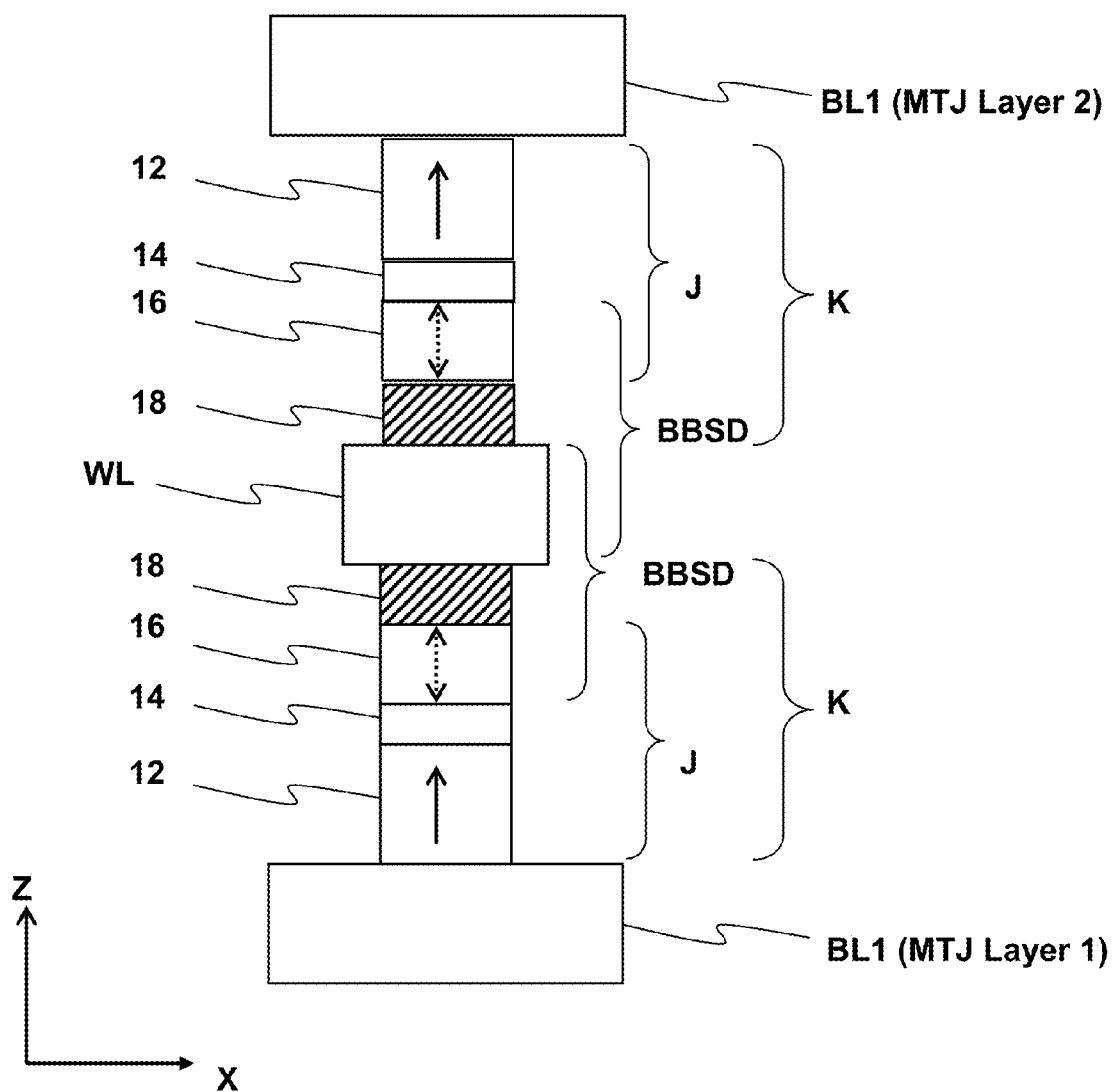
FIG. 5 is a cross sectional view of a stacked magnetic memory cells made with perpendicular magnetic materials including a back to back Schottky diode built into the structures whereby the two stacked memory cells share a common word line
Figure 9:
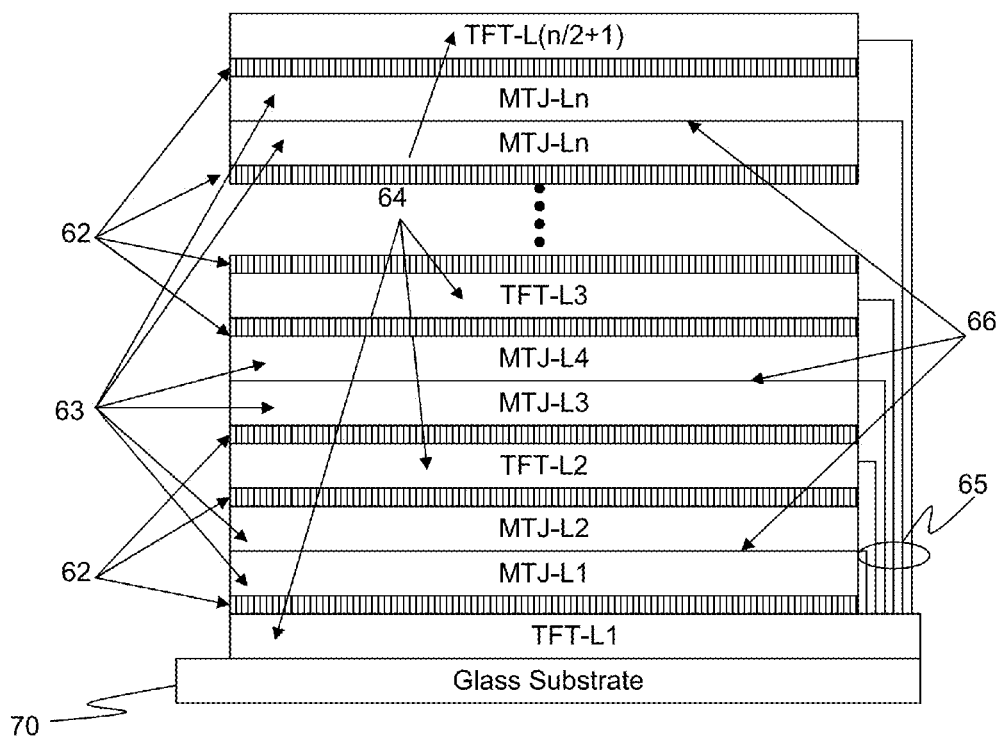
FIG. 9 is a cross section view of a three-dimensional memory array made in accordance with a third embodiment of the present invention

FIG. 9 is a cross section view of a three-dimensional memory array made in accordance with a third embodiment of the present invention. Memory arrays (63) are cross-point MRAM arrays made according to FIG. 6 whereby a BBSD is incorporated into each memory element. A low cost glass substrate (70) is provided with the first thin film transistor layer (TFT-L1) circuitry fabricated on the substrate. Such circuitry is fabricated at a technology node (Ft) which may be the same size as the technology node for the MTJ layers (Fm) but preferably for cost savings may be larger than Fm. Such circuitry may include the bandgap and decoder logic for the memory arrays (63), as well as selection transistors for the first memory array (MTJ-L1). Additional circuitry for the memory arrays (MTJ-L1-MTJ-Ln) is provided in various additional layers (64) of thin film transistors (TFT-L2-TFT-L(n/2+1)) disposed between every two memory arrays. The TFT circuitry is fabricated at a technology node (Ft) substantially larger than Fm, such as 40% to 1,000% larger than Fm. Interconnect layers (62) are fabricated at technology node Fm to provide for interconnection of the bit lines to the respective bit driver circuitry. Alternating pairs of memory arrays share common word lines (66) which are interconnected to a TFT layer (for example TFT-1) by interconnects (65). FIG. 5 shows a cross sectional view of the respective memory cells on different memory arrays that share a common word line at the interface (66) of the two memory arrays.

The placement of the relatively large thin film transistors across a large area, as indicated in FIG. 10, enables interconnection to the bit and word lines not at the end of such lines, but at various intermediate points along the lines, thereby minimizing the complexity of interconnection. Additional interconnects (65) are made from one or more TFT layers to related bandgap and decoder logic (not shown) which may or may not reside on the TFT-L1 circuitry layer. Preferably, bandgap and decoder logic transistors are located on the same layer or in close proximity to the respective bit or word selection transistors in order to provide for shorter interconnects, which provides for higher speed operation and lower cost due to lower complexity of construction, in which case such circuitry would be located on each TFT layer. In this embodiment, the intermediate TFT layers include transistors for the bit drivers of the MTJ layer residing directly above the TFT layer and below the TFT layer. Hence, the number of transistors on such intermediate TFT layer would be at least 2×(N×2)=4N. Alternatively, a TFT layer may be fabricated as two layers, a first layer providing the bit driver transistors for the MTJ layer below the TFT layer, and a second layer providing the bit driver transistors for the MTJ layer above the TFT layer.

It should be noted that the order of the layers (MTJ and TFT) indicated in the embodiments described above may be modified without diverting from the scope of the present invention. A key aspect of the present invention is that high density nonvolatile cross-point memory devices may be constructed in Back End Of Line (BEOL) facilities without the need for the high cost front end processing of silicon semiconductor production lines.

There is wide latitude for the choice of materials and their thicknesses within the embodiments of the present disclosure.

The pinned layer 12 can have a thickness of about 1-100 nm and more specifically of about 3-50 nm and coercivity measured along its easy axis of about 1000 Oe or higher and more specifically of about 2000-5000 Oe. The layer 12 can be made of magnetic material with perpendicular anisotropy such as Co, Fe or Ni-based alloys such as FePt, FePd, CoFeB, FeB, CoFeCrB, CoFeVB or similar, and/or their based multilayers or/and laminates such as CoFe/CoFeTb, CoFeB/CoGd, Fe/TbFe, CoFe/Ta, CoFeB/W, CoFeB/Cr, Co/Pt, Co/Pd, Co/Au, CoFe/Pt, Fe/Pt, Fe/Pd, Ni/Cu or similar.

The free layer 16 can have a thickness of about 1-5 nm and more specifically of about 1.5-2.5 nm and coercivity less than 1000 Oe and more specifically of about 200-500 Oe. The free layer 16 can be made of soft magnetic material with perpendicular anisotropy such as Co, Fe or Ni-based alloys such as CoFeB, FeB, CoFeCrB, CoFeVB, FeCrB, FeVB or similar, and/or multilayers and/or laminates such as CoFeB/(CoFe/Pt), CoFeB/(Co/Pd), CoFe/W, CoFeB/Ta, CoFeB/Cr, Co/Pt, Co/Pd, Co/Au, CoFe/Pt, Fe/Pt, Fe/Pd, Ni/Cu or similar.

The tunnel barrier layer 14 can have a thickness of about 0.5-2.5 nm and more specifically of about 0.8-1.3 nm. The tunnel barrier layer can be made of $MgO$, $Al_2O_3$, $Ta_2O_5$, $TiO_2$, Mg-MgO, ZrOx and similar materials and/or their based multilayers.

TFTs are widely used in the flat panel display industry; hence, it is known in the art how to fabricate such transistors. A range of materials for such transistors will be described, but is not intended to limit the present invention to such materials.

The TFT insulator layer can be made of $SiO_2$, $Al_2O_3$, SiN, and other similar materials and/or their based laminates, or polymer films such as backed photo-resist, polyimide and other similar materials. Thickness of the insulator layer 31 can be in a range from 100 nm through 5 μm.

A TFT semiconductor layer can be made of poly-Si, CdSe and others, or more preferably from a host of amorphous oxide semiconductors materials including but not limited to $SnO_2$, $In_2O_3$, CdO, $Cu_2O$, InGaZnO, ZnSnO, ZnO, InZnO AgSbO$_3$, $2CdO.GeO_2$, $2CdO.PbO$, $CdS.In2S_x$, $InGaO_3(ZnO)_m$, (m<=4) and others. Incorporation of thin film oxide semiconductor transistors in electronic devices are disclosed in the following three references which are hereby incorporated in their entirety by reference. (1) Present status of amorphous In—Ga—Zn—O thin-film transistors, Toshio Kamiya, Kenji Nomura and Hideo Hosono, 2010 Sci. Technol. Adv. Mater. 11 044305, (2) Short channel device performance of amorphous InGaZnO thin film Transistor, Sanghun Jeon, Anass Benayad, Seung-Eon Ahn, Sungho Park, Ihun Song, Changjung Kim, and U-In Chung, APPLIED PHYSICS LETTERS 99, 082104 (2011) and (3) Nanometer-Scale Oxide Thin Film Transistor with Potential for High-Density Image Sensor Applications, Sanghun Jeon, Sungho Park, Ihun Song, Ji-Hyun Hur, Jaechul Park, Hojung Kim, Sunil Kim, Sangwook Kim, Huaxiang Yin, U-In Chung, Eunha Lee, and Changjung Kim, Applied Materials & Interfaces, Vol. 3, No. 1, 1-6, 2011. A thickness of the semiconductor layer 32 can be in a range from 10 nm through 5000 nm, and more specifically in a range from 50 nm through 200 nm.

A TFT gate insulator layer can be made of $SiO_2$, SiON, $SiN_x$ alumina, or other suitable dielectric material. A thickness of the gate insulator layer can be in a range from 10 nm through 1000 nm, and more specifically in a range from 50 nm through 200 nm.

The bit BL and word WL conductor lines can be made of Cu, Al, Au, Ag, AlCu, Ta/Au/Ta, Cr/Cu/Cr, poly-Si and/or similar materials and/or their based laminates.

The amorphous semiconductor layer 18, when coupled to a conductive line and one of the metal layers of the MTJ comprises a back to back Schottky diode, can be made of Silicon (Si), Zinc Oxide (ZnO), Indium Gallium Zinc Oxide (IGZO), or a host of other semiconductor materials.

It is understood that the above description is intended to be illustrative, and not restrictive. Many other embodiments will be apparent to those of skill in the art upon reviewing the above description. The scope of the invention should be, therefore, determined with reference to the appended claims, along with the full scope of equivalents to which such claims are entitled.

What is claimed is:

1. A memory device, comprising:
   a substrate,
   a memory array disposed on or above the substrate surface, arranged in a matrix and comprising a plurality of parallel first conductive lines, a plurality of parallel second conductive lines overlapping the first conductive lines at a plurality of intersection regions, a plurality of memory cells, each memory cell being disposed at an intersection region of the conductive lines, electrically coupled to one of the first conductive lines at a first terminal and to one of the second conductive lines at a second terminal, and comprising a controllable electrical resistance,
   wherein each conductive line is electrically coupled to at least two thin film transistors and
   wherein said transistors are substantially positioned above or below the memory array.

2. The device according to claim 1 whereby the thin film transistors have a minimum feature size 40% or larger than a minimum feature size of the memory cells.

3. The device according to claim 1 whereby the thin film transistors are located above or below the memory cell array.

4. The device according to claim 1 whereby the memory cell is a magnetic tunnel junction comprised of at least a pinned ferromagnetic layer with fixed magnetization direction and a free ferromagnetic layer with a reversible magnetization direction, the pinned and free layers are separated from each other by a thin tunnel barrier layer.

5. The device according to claim 1 whereby the memory array is a resistance random access memory array.

6. The device according to claim 1 whereby the substrate is a glass substrate.

7. The device according to claim 1 whereby it is an embedded memory residing on chip above circuitry of a microprocessor, FPGA, ASIC, or other integrated circuit.

8. The device according to claim 2 whereby the thin film transistors have a minimum feature size 280% or larger than a minimum feature size of the memory cells.

9. The device according to claim 2 whereby the thin film transistors have a minimum feature size 1000% or larger than a minimum feature size of memory cells.

10. The device according to claim 1 whereby thin film transistors related to the decoder logic are fabricated in close proximity to the driver selection transistors and substantially positioned above or below the memory array.

11. A memory device, comprising:
a substrate,
a plurality of memory arrays disposed above the substrate surface, each memory array arranged in a matrix and comprising a plurality of parallel first conductive lines, a plurality of parallel second conductive lines overlapping the first conductive lines at a plurality of intersection regions, a plurality of memory cells, each memory cell being disposed at an intersection region of the conductive lines, electrically coupled to one of the first conductive lines at a first terminal and to one of the second conductive lines at a second terminal, and comprising a controllable electrical resistance,
wherein each conductive line is electrically coupled to at least two thin film transistors and
wherein said transistors are substantially positioned above or below the memory array.

12. The device according to claim 11 whereby the thin film transistors have a minimum feature size 40% or larger than a minimum feature size of the memory cells.

13. The device according to claim 11 whereby the thin film transistors are located at layers above, below or between the memory arrays.

14. The device according to claim 11 whereby the memory cell is a magnetic tunnel junction comprised of at least a pinned ferromagnetic layer with fixed magnetization direction and a free ferromagnetic layer with a reversible magnetization direction, the pinned and free layers are separated from each other by a thin tunnel barrier layer.

15. The device according to claim 11 whereby the memory array is a resistance random access memory array.

16. The device according to claim 11 whereby the substrate is a glass substrate.

17. The device according to claim 11 whereby it is an embedded memory residing on chip above circuitry of a microprocessor, FPGA, ASIC, or other integrated circuit.

18. The device according to claim 12 whereby the thin film transistors have a minimum feature size 280% or larger than a minimum feature size of the memory cells.

19. The device according to claim 12 whereby the thin film transistors have a minimum feature size 1000% or larger than a minimum feature size of the memory cells.

20. The device according to claim 11 whereby thin film transistors related to the decoder logic are fabricated in close proximity to the driver selection transistors and substantially positioned above or below the memory array.

21. The device according to claim 1 wherein a back to back Schottky diode is located between each memory cell and one of the said conductive lines.

22. The device according to claim 11 wherein a back to back Schottky diode is located between each memory cell and one of the said conductive lines.

* * * * *